United States Patent [19]

Pawlowski

[11] Patent Number: 4,631,245

[45] Date of Patent: Dec. 23, 1986

[54] PHOTOSENSITIVE COMPOSITION ADMIXTURE OF A DIAZONIUM SALT POLYCONDENSATION PRODUCT AND POLYMERIC BINDER WITH CARBOXYL SIDE CHAIN GROUPS

[75] Inventor: Georg Pawlowski, Wiesbaden, Fed. Rep. of Germany

[73] Assignee: Hoechst Aktiengesellschaft, Frankfurt am Main, Fed. Rep. of Germany

[21] Appl. No.: 697,925

[22] Filed: Feb. 4, 1985

[30] Foreign Application Priority Data

Feb. 8, 1984 [DE] Fed. Rep. of Germany ....... 3404366

[51] Int. Cl.$^4$ ................................................ G03C 1/60
[52] U.S. Cl. .................................... 430/175; 430/157; 430/176; 430/302; 430/309; 430/331
[58] Field of Search .................. 430/175, 176, 157

[56] References Cited

U.S. PATENT DOCUMENTS

| | | | |
|---|---|---|---|
| 2,861,058 | 11/1958 | Unruh et al. | 430/287 |
| 3,396,019 | 8/1968 | Uhlig | 430/175 |
| 3,725,069 | 4/1973 | Hammond | 430/175 |
| 3,847,614 | 11/1974 | Mattor | 430/175 |
| 3,867,147 | 2/1975 | Teuscher | 430/175 |
| 4,123,276 | 10/1978 | Kita et al. | 430/176 |
| 4,387,151 | 6/1983 | Bosse et al. | 430/175 |

FOREIGN PATENT DOCUMENTS

| | | | |
|---|---|---|---|
| 1024803 | 1/1978 | Canada | 430/175 |
| 1172492 | 8/1984 | Canada | 430/175 |
| 1352411 | 5/1974 | United Kingdom | 430/175 |

*Primary Examiner*—Charles L. Bowers, Jr.
*Attorney, Agent, or Firm*—Schwartz, Jeffery, Schwaab, Mack, Blumenthal & Evans

[57] ABSTRACT

Disclosed is a photosensitive composition which comprises a diazonium salt polycondensation product and, as the binder, a reaction product of an intramolecular anhydride of an organic polycarboxylic acid with a polymer containing hydroxyl groups, which does not contain any further functional groups which are capable of reaction with acid anhydrides. The composition is suitable for use in the production of printing plates and photoresists. It can be developed with neutral or alkaline aqueous solutions and yields printing plates having a good ink receptivity and producing large print runs.

18 Claims, No Drawings

PHOTOSENSITIVE COMPOSITION ADMIXTURE OF A DIAZONIUM SALT POLYCONDENSATION PRODUCT AND POLYMERIC BINDER WITH CARBOXYL SIDE CHAIN GROUPS

BACKGROUND OF THE INVENTION

The present invention relates to photosensitive compositions and, in particular, to such compositions suitable for the production of printing plates. Specifically, the invention relates to such compositions comprising diazonium salt polycondensation products and a polymeric binder.

German Offenlegungsschrift No. 2,024,244 (corresponding to U.S. Pat. No. 3,867,147) discloses photosensitive recording materials comprising cocondensation products of condensible diazonium salts and other non-photosensitive condensible compounds, optionally combined with polymeric binders, which are used for producing printing plates. These photosensitive materials are distinguished by their high photosensitivity and good print runs. The print run obtained is particularly large if water-insoluble binders, for example, polyvinyl formal, are used, but such layers can only be properly processed by means of developers containing a considerable amount of volatile organic solvents.

German Offenlegungsschrift No. 3,130,987 describes similar compositions which comprise styrene-maleic anhydride copolymers as the binders and which can be developed with purely aqueous alkaline solutions. These binders usually have acid numbers well over 100. The printing plates obtained using these compositions, however, yield print runs which are inferior to those of printing plates containing binders which are insoluble in aqueous alkaline solutions.

German Offenlegungsschrift No. 3,036,077 discloses corresponding compositions which contain binders comprising polymers with alkenylsulfonylurethane side groups. These compositions can also be developed by means of purely aqueous solutions. However, when the compositions are processed to form lithographic printing plates, they yield light cured coatings, in which ink receptivity is insufficient.

From U.S. Pat. No. 2,861,058, photosensitive polymers are known, having cinnamate and dicarboxylic acid monoester side groups. These polymers contain a relatively high amount of acid groups, corresponding to acid numbers from at least 100 to about 300, in order to render the coatings soluble in aqueous alkaline solutions.

In German Offenlegungsschrift No. 2,751,060, photosensitive compositions are described which comprise a photosensitive resin and a cellulose ether dicarboxylic acid halfester. These compositions are used in the production of photoresist coatings and have the advantage of a good etch resistance. Due to the strongly hydrophilic nature of the cellulose which serves as the parent substance, the oleophilic character of these polymers is, in most cases, inadequate for use in the printing image areas of printing plates. Moreover, since the cellulose molecule has a given molecular size and structure, it is difficult to vary its properties to a sufficient extent by substitution.

SUMMARY OF THE INVENTION

It is an object of the present invention to provide a negative-working photosensitive composition which is suitable for use in the production of printing plates, particularly lithographic printing plates, and which has all the advantages of the known compositions based on diazonium salt polycondensation products.

It is another object to provide such a composition which can be developed by means of practically solvent-free, neutral or alkaline aqueous solutions, and which, at the same time, yields printing plates producing large print runs and having a good ink receptivity. Heretofore, those properties could only be achieved with printing plates requiring the addition of relatively large amounts of organic solvents in the developing process.

Still another object resides in providing an improved photosensitive recording material utilizing the compositions according to the invention. In accomplishing these objects, there has been provided according to one aspect of the present invention a photosensitive composition which comprises a diazonium salt polycondensation product and a non-photosensitive polymeric binder having carboxyl side groups, which is soluble, or at least swellable, in aqueous alkaline solutions, wherein the binder comprises a reaction product of an intramolecular anhydride of an organic polycarboxylic acid with a synthetic polymer containing hydroxyl groups and having no further functional groups which are capable of reaction with acid anhydrides.

In accordance with another aspect of the invention, there has been provided a photosensitive recording material comprising a support and a photosensitive coating comprised of the photosensitive composition described above.

Further objects, features and advantages of the invention will become apparent from the detailed description of preferred embodiments which follows.

DETAILED DESCRIPTION OF THE PREFERRED EMBODIMENTS

The acid anhydride according to the invention is preferably derived from a dicarboxylic or tricarboxylic acid, particularly from a dicarboxylic acid and may have one, two or several rings.

Particularly preferred binders are obtained by reacting with acid anhydrides corresponding to one of the formulae I, II or III

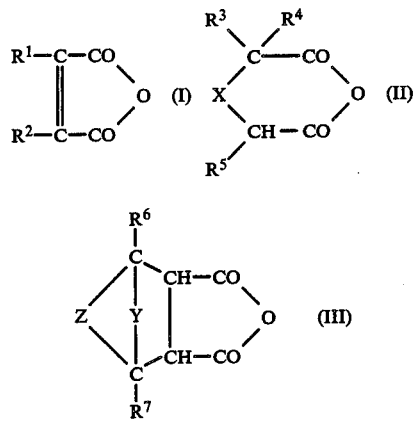

wherein
$R^1$ and $R^2$ individually are selected from hydrogen atoms and alkyl groups, or are interconnected to form an aromatic or heteroaromatic, unsubstituted or substituted and optionally partially hydrogenated five-membered or six-membered ring which may be fused with up to two aromatic or cycloaliphatic rings, $R^3$, $R^4$ and $R^5$ individually are selected from hydrogen atoms and alkyl groups, further, $R^3$ and $R^5$ can be interconnected to form an unsubstituted or substituted, saturated or unsaturated aliphatic ring which, inclusive of X, may have five or six ring members, $R^6$ and $R^7$ are selected from hydrogen atoms and alkyl groups, X is a single bond, an unsubstituted or substituted 1,1-alkylene group or 1,1-cycloalkylene group, an oxygen atom or a sulfur atom, Y is an oxygen atom or a sulfur atom, a 1,1- or 1,2-alkylene group or a 1,2-alkenylene group, which may optionally be fused with an aromatic or cycloaliphatic ring, and Z is selected from ring members required for the completion of a saturated or unsaturated, unsubstituted or substituted ring, this ring optionally being fused with up to two aromatic or cycloaliphatic rings.

If $R^1$, $R^2$, $R^3$, $R^4$, $R^5$, $R^6$, or $R^7$ stand for alkyl groups, the latter generally have from 1 to 4, preferably 1 or 2, carbon atoms. Substituents which may be bonded to the aromatic or cycloaliphatic rings include, for example, alkyl groups, alkoxy groups, halogen atoms, nitro groups or carboxyl groups.

Examples of suitable acid anhydrides include:

Maleic anhydride and derivatives thereof, for example, dimethyl maleic anhydride or citraconic anhydride;

succinic anhydride and derivatives thereof, for example, methyl succinic anhydride;

glutaric anhydride and derivatives thereof, for example, 3-methyl glutaric anhydride, 3,3-tetramethylene glutaric anhydride, or camphoric acid anhydride;

3-oxa-glutaric anhydride and derivatives thereof;

phthalic anhydride and substitution products thereof, for example, chloro, nitro, or carboxyphthalic anhydride, partially or completely hydrogenated phthalic anhydrides, for example, hexahydrophthalic anhydride or cyclohexene-1,2-dicarboxylic acid anhydride;

naphthalene-2,3-dicarboxylic acid anhydride or naphthalene-1,8-dicarboxylic acid anhydride and substitution products thereof;

pyridine-o-dicarboxylic acid anhydride and substitution products tereof;

pyrazine-o-dicarboxylic acid anhydride and substitution products thereof;

furan-o-dicarboxylic acid anhydride or furan-2,5-dicarboxylic acid anhydride, the substitution products thereof and the partially or completely hydrogenated derivatives thereof;

thiophene-o-dicarboxylic acid anhydride or thiophene-2,5-dicarboxylic acid anhydride, the substitution products thereof and the completely or partially hydrogenated derivatives thereof;

dicyclic or polycyclic anhydrides formed by the Diels-Alder reaction of a diene with maleic anhydride, for example, the addition products from furan, anthracene, cyclohexadiene-1,3 or cyclopentadiene with maleic anhydride.

The products obtained from the reaction with maleic anhydride, phthalic anhydride, succinic anhydride or 3-oxa-glutaric anhydride are preferred.

Synthetic polymers containing hydroxy groups, which can be used include, in particular, polymers having vinyl alcohol units. Also useful are epoxy resins and saponified epoxy resins, copolymers of allyl alcohol or higher molecular weight unsaturated alcohols, polyhydroxyalkyl acrylates and polyhydroxyalkyl methacrylates and similar polymers.

Suitable polymers containing vinyl alcohol units include partially saponified polyvinyl esters, polyvinyl acetals having free hydroxy groups and corresponding reaction products of copolymers with vinyl ester units or vinyl acetal units or vinyl alcohol units.

The molecular weight of the binders containing carboxyl groups can vary within wide limits. Generally, the binders used have average molecular weights in the range between 5,000 and about 200,000 or above, preferably between 10,000 and 100,000. The acid numbers of the binders can generally be in the range between 5 and 80, preferably between 10 and 70. The acid numbers of the polymers are thus clearly lower than the acid numbers of the binders which have hitherto been used in photosensitive compositions of the same generic type, as far as these compositions were suitable and intended for the development with aqueous solutions.

The reaction between acid anhydride and polymer containing hydroxy groups proceeds very smoothly and is a quantitative reaction in many cases; it is therefore very readily reproducible. As a consequence, it is possible to exactly and reproducibly adjust the desired acid number of the binder, for example, for the application of a particular developer.

The reaction can be run in ketones, for example, butanone, or tetrahydrofuran, dioxane or other ethers. As catalysts, tertiary amines are appropriately employed. In general, from 0.5 to 20 parts by weight of anhydride, from 1,000 to 3,000 parts by weight of solvent and from 0.5 l to 5 parts by weight of tertiary amine are used per 100 parts by weight of polymer containing hydroxy groups.

Suitable diazonium salt polycondensation products are condensation products of condensible aromatic diazonium salts, for example, of diphenylamine-4-diazonium salts, with aldehydes, preferably with formaldehyde. It is particularly advantageous to use co-condensation products containing, in addition to the diazonium salt units, other nonphotosensitive units which are derived from condensible compounds, particularly from aromatic amines, phenols, phenol ethers, aromatic thioethers, aromatic hydrocarbons, aromatic heterocyclic compounds and organic acid amides. These condensation products are described in German Offenlegungsschrift No. 2,024,244. Generally, all diazonium salt polycondensation products described in German Offenlegungsschrift No. 2,739,774 are suitable.

The diazonium salt units A—$N_2X$ are preferably derived from compounds corresponding to the formula $$(R^8-R^9-)_pR^{10}-N_2X$$

wherein X is the anion of the diazonium compound, p is an integer from 1 to 3, $R^8$ is an aromatic radical which is capable of condensation with an active carbonyl compound, in at least one position, $R^{10}$ is a phenylene group, and $R^9$ is a single bond or one of the groups:

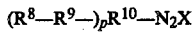
—$(CH_2)_q$—$NR^{11}$—,

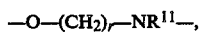
—O—$(CH_2)_r$—$NR^{11}$—,

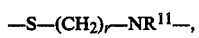
—S—$(CH_2)_r$—$NR^{11}$—,

—S—CH$_2$CO—NR$^{11}$—,

—O—R$^{12}$—O—,

—O—,

—S—, or

—CO—NR$^{11}$—, wherein q is a number from 0 to 5, r is a number from 2 to 5, R$^{11}$ is a hydrogen atom, an alkyl group having from 1 to 5 carbon atoms, an aralkyl group having from 7 to 12 carbon atoms or an aryl group having from 6 to 12 carbon atoms, and R$^{12}$ is an arylene group having from 6 to 12 carbon atoms.

The compositions according to the present invention generally comprise from 5 to 90, preferably from 10 to 70, percent by weight of diazonium compound, and from 95 to 10, preferably from 90 to 30, percent by weight of polymeric binder.

To stabilize the photosensitive composition, it is advantageous to add a compound having an acid character. Compounds which can be used include mineral acids and strong organic acids, with phosphoric acid, sulfuric acid, perchloric acid, boric acid or p-toluene sulfonic acid being preferred. Phosphoric acid is a particularly suitable acid.

Plasticizers, adhesion promoters, dyes, pigments and color precursors can also be added to the compositions. The types and quantities of such additions depend upon the field of application for which the photosensitive composition is intended. In principle, care must be taken that the added substances do not absorb an excessive portion of the actinic light which is required for cross-linking, because this would result in a reduction of the practical sensitivity to light.

In addition, the light-sensitive compositions can contain dyes and/or pigments which may serve to enhance the contrast upon exposure and also to harden the layer. Suitable dyes are, for example, specified in U.S. Pat. No. 3,218,167 and No. 3,884,693. Particularly suitable are, for example, Victoria Pure Blue FGA, Renol Blue B2G-H (Color Index 74,160), Crystal Violet or Rhodamine 6 GDN (C.I. 45,160). To enhance the image contrast after exposure, Metanil Yellow (C.I. 13,065), Methyl Orange (C.I. 13,025) or phenylazodiphenylamine can be used.

For particular purposes it can be favorable to admix the photosensitive compositions of the invention with further polymers in quantities of up to 40 percent by weight, relative to the above-described polymeric binders. Resins which contain hydroxy groups or carboxyl groups or amide or urethane groupings are advantageous for this purpose.

In many cases, an addition of binders which differ from the above-described carboxyl group-containing binders results in an undesired deterioration of numerous properties of the photosensitive composition, and this deterioration can usually be ascribed to an incompatibility with the individual constituents of the coating. As against this, the aforementioned advantageous additional resins can, for example, lead to an improvement in abrasion resistance and thus to an increase in the number of printed copies, if the composition is used in a lithographic printing plate.

Preferred additional polymers include polymers which contain amide groups or urethane groups. The polyamides used according to German Offenlegungsschrift No. 2,218,821, the polyurethanes disclosed in German Offenlegungschrift No. 2,948,554, or the sulfonylurethanes disclosed in German Offenlegungsschriften Nos. 2,053,363 and 2,053,364 are, for example, advantageously used for the above-mentioned purpose.

Additions of polyamides and polyurethanes which have approximately the same molecular weights as the polymers containing carboxyl groups, which are used in the photosensitive composition, have proved to be particularly suitable.

Within the scope of the present invention, the following weight proportions of the most important components of the photosensitive composition are preferred, which are, in each case, based on the content of non-volatile constituents, i.e., the constituents of the solid photosensitive coating obtained after evaporation of the solvent:

| | |
|---|---|
| Binder: | 30 to 90% |
| diazonium salt poly-condensation product: | 10 to 70% |
| acid: | 0 to 10% |
| dye or pigment: | 0 to 12% |
| dye which changes its color upon exposure: | 0 to 5% |

The support material is coated from appropriate organic solvents or solvent mixtures, generally by flow-coating, spraying or dipping.

Suitable solvents include alcohols, ketones, esters, ethers, and the like. The partial ethers of glycols or of ketoalcohols have proved to be favorable solvents, for example, ethylene glycol monomethyl ether.

Suitable supports are, for example, magnesium, zinc, copper, mechanically, chemically and electrochemically roughened aluminum, anodically oxidized aluminum, steel, and also polyester film or cellulose acetate film, Perlon gauze etc., the surface of which, optionally, may have been subjected to a pretreatment. The support material may function as the final support or as a temporary support material from which the photosensitive coating is transferred by lamination to the workpiece to be processed.

The recording material which is prepared using the photosensitive compositions of the invention serves, on the one hand, to produce images on suitable supports or receptor sheets and, on the other hand, to produce reliefs which are used as printing plates, screens, resists, and the like.

In addition, it is also possible to use the photosensitive compositions for the formulation of UV-hardenable printing inks or for the preparation of lacquers which are hardenable by ultraviolet radiation and which can be used for the protection of surfaces.

Primarily, the compositions are used for the production of lithographic printing plates, in which aluminum is the preferred support material.

It is particularly preferred to pretreat the aluminum used for this purpose in the usual manner, for example, by a mechanical, chemical or electrochemical roughening process which is, optionally, followed by an anodic oxidation. A further treatment of this support material, for example, with polyvinyl phosphonic acid, alkali metal silicate, phosphate, hexafluorozirconate, chromate, borate, polyacrylamide and cellulose derivatives is advantageous.

The recording materials obtained from the compositions are processed in the conventional manner, by exposing imagewise and washing out the unexposed areas of the coating with a suitable developer.

The recording material is exposed under an original, as is known in the art, using light sources which emit light with the highest possible spectral fraction in the near ultraviolet region. The material can also be exposed by laser irradiation. Suitable lasers for irradiation are shorter-wave lasers, for example, Ar lasers, krypton ion lasers, helium/cadmium lasers, emitting in the region between about 300 and 600 nm and, for some coatings, even $CO_2$ lasers, which emit at about 10.6 $\mu$m, or YAG lasers emitting at about 1.06 $\mu$m.

As the developer solutions, substantially neutral or alkaline aqueous solutions are used, which have a pH value in the range from 6 to 14, preferably from 7.5 to 12, and which contain buffer salts, for example, water-soluble alkalimetal phosphates, silicates, borates, carbonates, acetates or benzoates. Additional constituents used are wetting agents, preferably anionic wetting agents and, if appropriate, water-soluble polymers. The solution can also contain minor amounts, for example, up to 5 percent by weight, preferably not more than 2 percent by weight, or water-miscible organic solvents. It is preferred to use solvents having low volatility, for example, araliphatic alcohols, the vapor pressure of which is of no consequence in the handling of the developer.

Development can be performed in the conventional manner by dipping, spraying, brushing or wiping-over with a pad.

The binders containing carboxyl groups, which are used according to the present invention, can easily and reproducibly be prepared from inexpensive starting materials. They are readily compatible with other constituents of the coating and are readily combined with each other and also with other polymers to form homogeneous coatings.

The coatings produced are hardly susceptible to scratching, they are easily developed and yield an excellent differentiation between image and non-image areas and a steep gradation.

The large print runs and the good ink receptivity obtained with printing plates prepared using the material of the present invention are particularly advantageous. The printing stencils are also highly resistant to alkaline developers.

It is extremely surprising that the materials of this invention are easily developable by means of ecologically acceptable, neutral or alkaline aqueous solutions, irrespective of the exceptionally low acid numbers of the binders.

In the examples which follow, the invention is explained in detail. Parts by weight and parts by volume are related as $g/cm^3$, percentages and quantitative proportions refer to units by weight, unless otherwise indicated.

EXAMPLE 1

50 parts by weight of a polyvinyl butyral which has a molecular weight of about 70,000 to 80,000 and comprises 71% of vinyl butyral units, 2% of vinyl acetate units and 27% of vinyl alcohol units, and 4 parts by weight of maleic anhydride were dissolved in 725 parts by weight of methyl ethyl ketone, while heating. The clear solution produced was admixed with 1 part by weight of triethylamine and was refluxed for five hours. After cooling, the solution was filtered and added dropwise to 10,000 parts by weight of distilled water. In the process, a white fibrous product was obtained, which was drawn off by suction and dried in vacuum at 40° C. to constant weight.

Yield: 52 parts by weight.
Analysis: C 61.9%; H 9.3%.
Acid Number: 30.

A coating solution was prepared having the following composition: 62 parts by weight of the above-described polymer, 21 parts by weight of a diazonium salt polycondensation product prepared from 1 mole of 3-methoxy-diphenylamine-4-diazonium sulfate and 1 mole of 4,4'-bis-methoxy-methyl-diphenylether in an 85% strength phosphoric acid and isolated as the mesitylene sulfonate, 2.5 parts by weight of phosphoric acid (85% strength), 3 parts by weight of Victoria Pure Blue FGA (Color Index Basic Blue 81), and 0.7 part by weight of phenylazodiphenylamine in 2,570 parts by weight of ethylene glycol monomethyl ether and 780 parts by weight of tetrahydrofuran. The coating was applied to an aluminum foil which had been roughened by brushing with an aqueous abrasive slurry and then pretreated with an 0.1% strength aqueous solution of polyvinyl phosphonic acid, and was thereafter dried.

The photosensitive coating thus produced, which had a coating weight of 0.95 $g/m^2$, was exposed for 30 seconds under a negative original, using a 5 kW metal halide lamp as the light source.

The exposed coating was treated with a developer solution having the following composition: 5.0 parts by weight of sodium octyl sulfate, 1.5 parts by weight of sodium metasilicate in 5 water, 1 part by weight of trisodium phosphate in 12 water, 0.5 part by weight of disodium hydrogen phosphate in 12 water, 92.0 parts by weight of water. The solution was applied with a plush pad such that the unexposed areas of the coating were properly removed. Development was followed by rinsing with water and drying.

The exposed and developed plate so prepared showed a solid step 4 of a silver film continuous-tone step wedge having a density range from 0.15 to 1.50, with density increments of 0.15.

The printing plate obtained in this manner yielded a print run of 40,000 printed sheets, when used on a sheet-fed offset press.

EXAMPLE 2

24.7 parts by weight of a copolymer of styrene and allyl alcohol, which comprises 46% of styrene units and 54% of allyl alcohol units and has a hydroxyl number of 192, was dissolved in 350 parts by weight of methyl ethyl ketone. One part by weight of maleic anhydride was added to the clear solution. When the maleic anhydride had dissolved, 0.5 parts by weight of triethylamine was added and the mixture was heated to reflux temperature. After five hours, the mixture was allowed to cool and the substantially clear solution was filtered and added dropwise to 5,000 parts by weight of distilled water. The powdery, white product obtained was drawn off by suction and dried as described in Example 1.

The yield amounted to 25 parts by weight of polymer having an acid number of 16.

A coating solution was prepared having the following composition: 86.5 parts by weight of the above-indicated binder, 29 parts by weight of the diazonium salt polycondensate described in Example 1, 3.5 parts by weight of phosphoric acid (85% strength), 4.3 parts by weight of Victoria Pure Blue FGA and 1 part by weight of phenylazodiphenylamine in 4,200 parts by weight of ethylene glycol monomethyl ether. The solution was applied to an aluminum foil which had been electrochemically roughened in nitric acid and thereafter anodically oxidized and post treated with polyvinyl phosphonic acid. The dry coating weight was 1.02 g/m$^2$.

Exposure and processing were carried out similarly to the procedures indicated in Example 1. Upon inking, a printing plate was obtained which was readily ink-receptive, and the non-image areas of which did not accept greasy printing ink.

When the printing plate was clamped on a sheet-fed offset press, it yielded thousands of good prints.

EXAMPLE 3

A polymer containing 61.3% of C and 9.3% of H and having an acid number of 8 was prepared in a procedure similar to that described in Example 1, by reacting 100 parts by weight of the polyvinyl butyral indicated in Example 1 with 1 part by weight maleic anhydride in 1,300 parts by weight of methyl ethyl ketone, precipitated in water and dried.

The binder so produced was used to prepare a coating solution having the composition specified in Example 1.

This coating solution was applied to aluminum foil which had been pretreated as indicated in Example 2 and was then dried. The coating weight was about 1 g/m$^2$.

The photosensitive coating was exposed for 30 seconds under a negative original, using a 5 kW metal halide lamp as the light source and was then developed with a developer which had the following compositions: 5.0 parts by weight of sodium octyl sulfate, 1.5 parts by weight of sodium metasilicate in 5 water, 1 part by weight of trisodium phosphate in 12 water, 1 part by weight of phenoxyethanol, 91.5 parts by weight of water.

The non-image areas of the photosensitive coating were already detached after a few seconds and, after wiping over with a plush pad, the plate was rinsed with water and dried.

The exposed and developed plate thus obtained had the same properties as that described in Example 1. The plate was gummed and then clamped on a sheet-fed offset press, where it yielded 220,000 good prints.

EXAMPLE 4

25 parts by weight of the polyvinyl butyral indicated in Example 1 and 10 parts by weight of maleic anhydride were dissolved in 400 parts by weight of methyl ethyl ketone, admixed with 1 part by weight of triethylamine and refluxed for 5 hours.

After precipitating in water, a polymer was obtained which contained 59.9% of C and 8.5% of H and had an acid number of 70.

A coating solution was prepared having the following composition: 34.1 parts by weight of the above-described polymer, 11.4 parts by weight of the diazonium salt polycondensation product specified in Example 1, 1.5 parts by weight of phosphoric acid (85% strength), 1.1 parts by weight of crystal violet (Color Index 42.555) and 1.1 parts by weight of phenylazodiphenylamine in 1,600 parts by weight of ethylene glycol monomethyl ether. The solution was applied to a support as indicated in Example 2. After drying, the coating had a weight of 0.98 g/m$^2$.

Processing was carried out similarly to Example 1. In this case, the printing plate was immersed in the developer for one minute after imagewise exposure and was then rinsed off with water. The printing plate thus obtained was excellently developed, i.e. even very fine halftone and line elements showed a differentiated reproduction, the non-image areas were free from staining or coating residues and a high resolution was attained.

When the printing plate was used for printing on a sheet-fed offset press, many prints of excellent quality were obtained.

EXAMPLE 5

46 parts by weight of the polyvinyl butyral specified in Example 1 and 3.6 parts by weight of phthalic anhydride were dissolved in 690 parts by weight of methyl ethyl ketone to give a clear solution and, after adding 1.1 parts by weight of triethylamine, the solution was refluxed for five hours. After cooling, the solution was added dropwise to 10,000 parts by weight of water and the fibrous, white polymer which was precipitated was drawn off by suction and dried.

Yield: 49 parts by weight.
Analysis: C 61.9%; H 9.2%.
Acid Number: 16.

A coating solution was prepared having the following composition: 35.1 parts by weight of the above-described polymer, 23.4 parts by weight of a diazonium salt condensation product prepared by condensing 1 mole of 3-methoxy-diphenylamine-4-diazonium sulfate with 1 mole of 4-methyl-4'-methoxymethyldiphenylether and then with 1 mole of 4,4'-bis-methoxymethyl-diphenylether in an 85% strength phosphoric acid and isolated as the mesitylene sulfonate, 2.1 parts by weight of phosphoric acid (85% strength), 1.5 parts by weight of Victoria Pure Blue FGA, and 1.1 parts by weight of phenylazodiphenylamine in 1,900 parts by weight of ethylene glycol monomethyl ether. The solution was applied to a support as indicated in Example 2 to give a dry coating weight of 0.95 g/m$^2$.

After exposing imagewise and developing with the developer solution specified in Example 1, a printing plate was obtained showing a very high resolution and a steep gradation. In proof printing, the image areas very quickly accepted printing ink. The behavior upon proof printing of the cleaned printing plate was not adversely influenced by the action of various treating chemicals.

EXAMPLES 6 TO 9

According to Example 5, the following acid anhydrides were reacted:
Example 6: cis-hexahydrophthalic anhydride
Example 7: 4,5-dichloro-phthalic anhydride
Example 8: 3-nitro-phthalic anhydride
Example 9: trimellitic anhydride.
In all cases, practically quantitative yields of the corresponding polymers were obtained.

The coatings which were prepared with these polymers, according to Example 5 and which were applied to supports as used in Example 2 could be developed with increasing ease using the developer solutions specified in Example 1 or Example 3.

The exposed and developed plates showing well differentiated images in all cases, yielded prints of high resolution and good quality, when they were clamped on a sheet-fed offset press.

EXAMPLE 10

20 parts by weight of the polyvinyl butyral specified in Example 1, and 1.6 parts by weight of pyridine-2,3-dicarboxylic acid anhydride, were dissolved in 280 parts by weight of methyl ethyl ketone. After adding 0.5 part by weight of triethylamine, the clear solution was refluxed for five hours. The solution, after being allowed to cool, was then added dropwise to 5,000 parts by weight of water and the precipitated polymer was drawn off by suction and dried. 20.5 parts by weight of a white, brittle polymer were obtained.

Analsis: C 62.2%; H 9.4%; N 0.6%.

Acid Number: 17.

A coating solution was prepared having the following composition: 88.7 parts by weight of the above-described polymer, 30 parts by weight of the diazonium salt condensate specified in Example 1, 4.6 parts by weight of phosphoric acid (85% strength), 4.3 parts by weight of Victoria Pure Blue FGA, and 1.1 parts by weight of phenylazodiphenylamine, 3,675 parts by weight of ethylene glycol monomethyl ether and 1,115 parts by weight of tetrahydrofuran. The solution was coated upon a support as indicated in Example 2 and dried. The coating weight was 1.03 g/m$^2$.

The photosensitive coating thus obtained was exposed for 25 seconds under a negative original, using a 5 kW metal halide lamp as the light source.

The exposed coating was developed within a few seconds using a developer solution of the following composition: 5.0 parts by weight of sodium octyl sulfate, 1.5 parts by weight of sodium metasilicate in 5 water, 1.0 part by weight of trisodium phosphate in 12 water, 92.5 parts by weight of water, which was applied with a plush pad.

In the exposed and developed plate, which was an excellently differentiated reproduction of the negative original, a solid step 4 of a continuous-tone step wedge was obtained.

EXAMPLE 11

294 parts by weight of the polyvinyl butyral specified in Example 1 and 10.3 parts by weight of maleic anhydride were dissolved in 4,170 parts by weight of methyl ethyl ketone and after adding 5 parts by weight of triethylamine, the solution was refluxed for five hours. The solution, after being allowed to cool, was added dropwise to 50,000 parts by weight of water and, in the process, a fibrous, white polymer was precipitated.

Analysis: C 62.0%; H 9.4%.

Acid Number: 13.

A coating solution was prepared having the following composition: 270 parts by weight of the above-described polymer, 165 parts by weight of the diazonium salt condensation product specified in Example 1, 17 parts by weight of Victoria Pure Blue FGA, 4 parts by weight of phenylazodiphenylamine, and 15 parts by weight of phosphoric acid (85% strength) in 10,500 parts by weight of ethylene glycol monomethyl ether, 2,400 parts by weight of tetrahydrofuran, and 800 parts by weight of butyl acetate. The solution was applied to a support as indicated in Example 2 and dried. The coating weight was 1.03 g/m$^2$.

The photosensitive coating was exposed imagewise as described in Example 10. It was swiftly processed using the developer specified in Example 10. After development, the plate was treated with a commercially available gumming agent. When the printing plate so produced was clamped on a sheet-fed offset press, it yielded more than 200,000 prints of excellent quality.

EXAMPLE 12

The coating solution described in Example 11 was applied to an aluminum foil which had been electrochemically roughened in hydrochloric acid, anodically oxidized and post-treated as indicated in Example 2, to give a dry coating weight of 0.95 g/m$^2$.

After exposure and development, the printing plate was clamped on a sheet-fed offset press. The printing test was stopped after printing 170,000 sheets, at which point the prints obtained still showed an excellent quality.

EXAMPLE 13

The photosensitive coating described in Example 3 was applied to five aluminum foils which had been treated according to Example 2.

The five printing plates obtained were stored in a drying oven which had been heated to 100° C., for periods ranging from one to five hours.

The photosensitive coatings, after being allowed to cool, were exposed for 25 seconds under a negative original and then treated for 45 seconds with the developer solution described in Example 3.

The plates, which had been stored in the drying oven for one or two hours respectively, did not show any noticeable extension of the stepwedge or any reduced speed of development, as compared with a plate processed in the usual manner. However, in the plate stored for three hours, a slightly reduced speed of development and an extension of the step-wedge by about one step was observed. In the plate stored for four hours, initial tendencies to scumming showed in non-image areas upon inking with a greasy printing ink, while the plate cured for five hours clearly accepted ink, even in the non-image areas.

The above-indicated results show that the photosensitive coating is rather insensitive to the action of heat.

EXAMPLES 14 TO 17

The maleic anhydride of Example 1 was replaced by the same quantities of the following aliphatic dicarboxylic acid anhydrides. Polymers of similar properties were obtained, which yielded exposed and developed plates showing a high resolution, a good reproduction upon printing and large print runs, when they were added to one of the coating solutions described in Example 1 or Example 3 and processed as indicated in these Examples.

| Example | Acid Anhydride | Acid Number |
|---|---|---|
| 14 | succinic anhydride | 26 |
| 15 | 3,3-tetramethylene-glutaric acid anhydride | 14 |
| 16 | camphoric acid anhydride | 12 |
| 17 | 3-oxa-glutaric-anhydride | 27 |

EXAMPLE 18

A coating solution prepared from 35.1 parts by weight of the polymer described in Example 11, 23.4 parts by weight of the diazonium salt polycondensate specified in Example 5, 2.3 parts by weight of phosphoric acid (85% strength), 2.0 parts by weight of Renol Blue B2G-H (Color Index 74,160) and 1.1 parts by weight of phenylazodiphenylamine in 1,800 parts by weight of ehtylene glycol monomethyl ether and 480 parts by weight of butyl acetate was applied to a support as indicated in Example 2, dried and processed as described in Example 1. The coating weight was 1.03 g/m².

The printing plate, which behaved excellently in the platemaking process, was clamped on a printing press and yielded a great number of prints showing an excellent resolution.

EXAMPLE 19

50 parts by weight of the polyvinyl butyral described in Example 1 and 8 parts by weight of 3-oxa-glutaric anhydride were dissolved in 700 parts by weight of methyl ethyl ketone. Then 1 part by weight of triethylamine was added and the mixture was refluxed for five hours. Upon cooling of the mixture, precipitation was carried out in 5,000 parts by weight of water and the fibrous product obtained was dried. Yield: 54 parts by weight of polymer having an acid number of 50.

A coating solution which had the following composition: 15.7 parts by weight of the above-described polymer, 15.7 parts by weight of the diazonium salt polycondensation product specified in Example 1, 1.0 part by weight of phosphoric acid (85% strength), 1.2 parts by weight of Renol Blue B2G-H (Color Index 74,160), and 0.2 part by weight of phenylazodiphenylamine in 1,200 parts by weight of ethylene glycol monomethyl ether was applied to a support as used in Example 2. The coating weight of the photosensitive coating after drying was 1.0 g/m².

Processing was carried out as indicated in Example 1. The exposed and developed plate thus obtained, which was very readily processed and showed a steep gradation and a high resolution, yielded a print run exceeding 100,000 printed sheets without any marked wear of the plate, when it was used for printing on a sheet-fed offset press.

EXAMPLES 20 TO 22

In these Examples, various hydroxyl group-containing polymers were used, which were reacted with a constant quantity of maleic anhydride. The polymers prepared as described in Example 1 were employed in coating solutions having compositions corresponding to the composition described in Example 18. Processing was carried out according to Example 3. In all cases, high-quality printing plates were obtained, showing exceptionally high chemical and mechanical resistances when they were used on a printing press, and which yielded large print runs.

EXAMPLE 20

20 parts by weight of the polyvinyl butyral described in Example 1 were reacted with 8 parts by weight of maleic anhydride in 350 parts by weight of methyl ethyl ketone and worked up as indicated in Example 1. The acid number was 70.

EXAMPLE 21

20 parts by weight of a polyvinyl butyral having a molecular weight of about 70,000 to 80,000 and comprising 79% by weight of vinyl butyral units, 2% by weight of vinyl acetate units and 19% by weight of vinyl alcohol units, were reacted with 8 parts by weight of maleic anhydride in 350 parts by weight of methyl ethyl ketone. The acid number was 73.

EXAMPLE 22

20 parts by weight of a polyvinyl butyral having a molecular weight of about 70,000 to 80,000 and comprising 86% by weight of vinyl butyral units, 2% by weight of vinyl acetate units and 12% by weight of vinyl alcohol units, were reacted with 8 parts by weight of maleic anhydride in 350 parts by weight of methyl ethyl ketone. The acid number was 43.

EXAMPLE 23

50 parts by weight of the polyvinyl butyral described in Example 1, and 4 parts by weight of maleic anhydride were dissolved in 725 parts by weight of methyl ethyl ketone while heating and, after adding 1 part by weight of triethylamine, the solution was refluxed for five hours. A 7.42% strength solution of the polymer in methyl ethyl ketone was thus obtained.

15 parts by weight of this solution were added dropwise to water. The polymer so produced had the composition indicated in Example 1.

A coating solution was prepared having the following composition: 50.5 parts by weight of a 7.42% strength solution of the above-described polymer in methyl ethyl ketone, 1.26 parts by weight of the diazo polycondensate specified in Example 1, 0.15 part by weight of phosphoric acid (85% strength), 0.18 part by weight of Victoria Pure Blue FGA and 0.04 part by weight of phenylazodiphenylamine in 154 parts by weight of ethylene glycol monomethyl ether. The solution was processed according to Example 1.

As the present formulation corresponded to the composition indicated in Example 1, with the exception that methyl ethyl ketone had been substituted for tetrahydrofuran, it was found, as expected, that the photosensitive coating obtained was substantially identical with the photosensitive coating described in Example 1 regarding its technical properties for platemaking and printing.

EXAMPLE 24

According to Example 11, a polymer containing 62.2% of C and 9.4% of H and having an acid number of 12.2 was prepared in the form of a 6.8% strength solution in methyl ethyl ketone. The polymer produced was not isolated from the reaction medium.

A coating solution was prepared having the following composition: 258 parts by weight of the above-described 6.8% strength solution of the polymer in methyl ethyl ketone, 16.7 parts by weight of the diazonium salt polycondensate specified in Example 5, 1.2 parts by weight of phosphoric acid (85% strength) 1.0 part by weight of Renol Blue B2G-H and 0.55 part by weight of phenylazodiphenylamine in 600 parts by weight of ethylene glycol monomethyl ether. The solution was applied and processed according to Example 18. The printing plate obtained corresponded to that described in Example 18, i.e. the use of the reaction solution including triethylamine did not have any adverse influence on storability and technical properties for printing and platemaking. After clamping on the printing press, a print run of well over 150,000 sheets was obtained.

EXAMPLE 25

The coating solution described in Example 24 was varied in such a way that 206 parts by weight of the 6.8% strength polymer solution therein described and 3.5 parts by weight of the polyurethane specified below were used. The polyurethane was prepared by reacting 1 mole of a prepolymer, obtained from tolylene diisocyanate and 1,1,1-trimethylol propane, in a molecular ratio of 3:1, with about 2.5 moles of hexane diol-1,6 in tetrahydrofuran. The product was precipitated in water and thereafter dried.

After processing of the solution as indicated in Example 24, a hardly noticeable reduction of developing speed was observed.

When the printing plate produced was clamped on a printing press and used for printing under identical conditions, a print run was attained which exceeded that of the preceding example by about 20%. An evaluation of the printing result showed, however, that this printing plate tended to a slight dot gain, compared with the printing plate of Example 24.

EXAMPLE 26

20 parts by weight of a terpolymer comprising 91% of vinyl chloride, 3% of vinyl acetate and 6% of vinyl alcohol and having an average molecular weight of 15,500 and a softening point of 77° C. was reacted with 2 parts by weight of 3-oxaglutaric anhydride, as described in Example 1. The polymer obtained had an acid number of 24.

A coating solution was prepared having the following composition: 55 parts by weight of a 6.4% strength solution of the above-described reaction product in methyl ethyl ketone, 1.79 parts by weight of the diazonium salt polycondensate specified in Example 1, 0.18 part by weight of phosphoric acid (85% strength), 0.06 part by weight of phenylazodiphenylamine and 0.13 part by weight of crystal violet in 140 parts by weight of ethylene glycol monomethyl ether was applied to an aluminum foil which had been mechanically roughened and post-treated with an 0.1% strength aqueous solution of polyvinyl phosphonic acid and was dried to give a coating weight of 0.8 g/m$^2$.

After exposure and development as indicated in Example 1, a printing plate was obtained which yielded several thousand good prints, when clamped on a printing press.

EXAMPLE 27

50 parts by weight of a polyvinyl formal having a molecular weight of about 25,000 to 30,000 and comprising 68% by weight of vinylformal units, 25% by weight of vinyl acetate units and 7% by weight of vinyl alcohol units (hydroxyl number 85), and 4 parts by weight of maleic anhydride were dissolved in 500 parts by weight of tetrahydrofuran to give a clear solution. This solution was admixed with 10 parts by weight of triethylamine, and the exothermic solution was refluxed for eight hours. After cooling, the solution was filtered and added dropwise to 8,000 parts by weight of water to produce a white, comparatively brittle product which was drawn off by suction and dried.

The yield amounted to 51 parts by weight of polymer having an acid number of 28.

A coating solution was prepared having the following composition: 20 parts by weight of the above-described polymer, 8 parts by weight of the diazonium salt polycondensation product specified in Example 1, 0.9 part by weight of phosphoric acid (85% strength), 1.1 parts by weight of Victoria Pure Blue FGA and 0.3 part by weight of phenylazodiphenylamine in 1,100 parts by weight of ethylene glycol monomethyl ether. The solution was applied to a support as described in Example 2 and dried. The coating weight was 0.99 g/m$^2$.

The photosensitive coating was exposed under a negative original, as indicated in Example 3, and was treated with the developer mixture described in Example 3.

The offset printing plate so produced had a coating which exhibited an exceptionally high mechanical resistance and yielded several thousand excellent quality prints, when used for printing on a sheet-fed offset press.

EXAMPLE 28

(Comparative Example)

A coating solution A comprising the following components was prepared in accordance with Example 6 of German Offenlegungsschrift No. 3,130,987: 15.0 parts by weight of a styrene-maleic acid ester copolymer, softening range from 190° to 205° C., acid number about 200, average molecular weight about 10,000, 15.0 parts by weight of the diazonium salt cocondensate specified in Example 1, 0.8 part by weight of Victoria Pure Blue FGA, 0.5 part by weight of phenylazodiphenylamine and 1.2 parts by weight of phosphoric acid (85% strength) in 900 parts by weight of ethylene glycol monomethyl ether.

An additional coating solution B was prepared by substituting the same quantity of the polymer described in Example 4 for the above-indicated copolymer.

The two solutions were applied to an aluminum foil which had been pretreated according to Example 2, to produce a coating weight of 1 g/m$^2$.

The two photosensitive coatings were exposed for 22 seconds under a negative original and developed with a developer mixture having the following composition: 5.0 parts by weight of sodium lauryl sulfate, 1.5 parts by weight of sodium metasilicate in 5 water, 1.5 parts by weight of trisodium phosphate in 12 water, 92 parts by weight of water.

The results obtained were as follows:

The photosensitivities of the two photosensitive coatings A and B were almost identical.

The contrast of the exposed, still undeveloped plate B was clearly better and more pleasant to the eye than the contrast of plate A.

After development, which proceeded swiftly in both cases, printing plates were obtained which were, on the whole, comparable. However, the gradation of plate B was somewhat steeper than that of plate A. The two plates were clamped on a printing press for the purpose of comparison.

The following results were obtained:

In proof printing, plate B accepted ink definitely more rapidly (by a factor of 2–3) than plate A. If an alkaline dampening solution was used, this effect was even more pronounced.

When running on, it was found that plate B clearly printed more open screen areas than plate A.

Moreover, plate A showed irregularities in the screen. After only 80,000 printed copies, the reproduction of the continuous-tone stepwedge was reduced by two steps. After printing the same number of copies, plate B did not show any irregularity in the screen. The reproduction of the continuous-tone stepwedge was reduced by about one step.

After 100,000 printed copies, plate A showed the first coating damage, while the screen and solid areas of plate B did not exhibit any damage, even after 150,000 printed copies.

On the whole, it can thus be stated that printing plate B, made according to the present invention, is superior to the prior art printing plate A in substantial criteria.

EXAMPLE 29

(Comparative Example)

According to Example 28, two coating solutions A 1 (German Offenlegungsschrift No. 3,130,987) and B 1 (according to this invention) were prepared, in which Renol Blue B2G-H was substituted for the Victoria Pure Blue FGA dye.

Coating, exposure and development were carried out as indicated in Example 28.

It was found that the dye used was incompatible with the binder of plate A1 and agglomerated. The exposed plate showed a pale gray color and even after development, contrast was insufficient. The gradation of printing plate B 1 was much steeper than that of printing plate A1. When plates A 1 and B 1 were used in a press run, the above-described results were basically repeated.

What is claimed is:

1. A photosensitive composition, comprising: a diazonium salt polycondensation product in admixture with a non-photosensitive polymeric binder having carboxyl side groups, said diazonium salt present in an amount sufficient to render said composition insoluble upon photoexposure, said binder being soluble or at least swellable in aqueous-alkaline solutions, the binder comprising the reaction product of an intramolecular anhydride of an organic polycarboxylic acid and a synthetic polymer containing vinyl alcohol units and having no further functional groups capable of reaction with acid anhydrides the amount of said anhydride being sufficient to render said composition soluble in an aqueous-alkaline developer if said composition is not subjected to photoexposure.

2. A photosensitive composition as claimed in claim 1, wherein the organic polycarboxylic acid comprises a dicarboxylic acid or a tricarboxylic acid.

3. A photosensitive composition as claimed in claim 2, wherein the acid anhydride comprises a compound corresponding to one of the formulae I, II or III

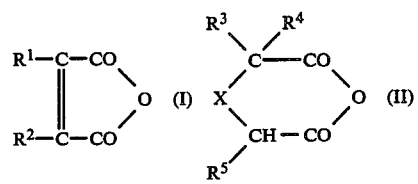

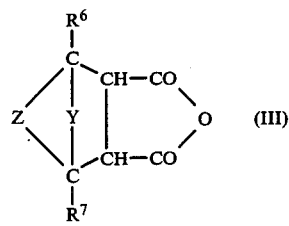

wherein $R^1$ and $R^2$ individually are selected from hydrogen atoms and alkyl groups and, further, can be interconnected to form an aromatic or heteroaromatic, unsubstituted or substituted and optionally partially hydrogenated five-membered or six-membered ring which may be fused with up to two aromatic or cycloaliphatic rings, $R^3$, $R^4$ and $R^5$ individually are selected from hydrogen atoms and alkyl groups, further, $R^3$ and $R^5$ can be interconnected to form an unsubstituted or substituted saturated or unsaturated aliphatic ring which, inclusive of X, may have five or six ring members, $R^6$ and $R^7$ are selected from hydrogen atoms and alkyl groups, X is a single bond, an unsubstituted or substituted 1,1-alkylene group or 1,1-cycloalkylene group, an oxygen atom or a sulfur atom, Y is an oxygen atom or a sulfur atom, a 1,1- or 1,2-alkylene group or a 1,2-alkenylene group, which may optionally be fused with an aromatic or cycloaliphatic ring, and Z is selected from ring members required for the completion of a saturated or unsaturated, unsubstituted or substituted ring, this ring optionally being fused with up to two aromatic or cycloaliphatic rings.

4. A photosensitive composition as claimed in claim 3, wherein the acid anhydride comprises maleic anhydride, phthalic anhydride, succinic anhydride or 3-oxaglutaric anhydride.

5. A photosensitive composition as claimed in claim 3, wherein the acid anhydride comprises the product formed in the Diels-Alder reaction of a diene with maleic anhydride.

6. A photosensitive composition as claimed in claim 1, wherein the synthetic polymer containing hydroxyl groups comprises a polyvinyl acetal or a polyvinyl acetate, having free hydroxyl groups.

7. A photosensitive composition as claimed in claim 1, wherein the diazonium salt polycondensation product comprises recurring units of A-$N_2$X and B, linked by intermediate members, A being a radical of a diazonium compound capable of condensation with formaldehyde, and B being the radical of a compound free of diazonium groups and capable of condensation with formaldehyde and selected from aromatic amines, phenols, phenol ethers, aromatic thioethers, aromatic hydrocarbons, aromatic heterocyclic compounds and organic acid amides.

8. A photosensitive composition as claimed in claim 7, wherein the diazonium salt polycondensation product comprises a product having recurrent units A-$N_2$X and B, which are linked by bivalent intermediate members derived from a carbonyl compound capable of condensation, the units A-N₂X being derived from compounds corresponding to the general formula $$(R^8-R^9-)_p R^{10}-N_2 X$$

wherein
X is the anion of the diazonium compound,
P is an integer from 1 to 3,
$R^8$ is an aromatic radical which is capable of condensation with an active carbonyl compound, in at least one position,
$R^{10}$ is a phenylene group, and
$R^9$ is a single bond or one of the groups: $-(CH_2)_q-NR^{11}-$, $-O-(CH_2)_r-NR^{11}-$, $-S-(CH_2)_r-NR^{11}-$, $-S-CH_2CO-NR^{11}-$, $-O-R^{12}-O-$, $-O-$, $-S-$, or $-CO-NR^{11}-$, wherein q is a number from 0 to 5, r is a number from 2 to 5, $R^{11}$ is a hydrogen atom, an alkyl group having from 1 to 5 carbon atoms, an aralkyl group having from 7 to 12 carbon atoms or an aryl group having from 6 to 12 carbon atoms, and $R^{12}$ is an arylene group having from 6 to 12 carbon atoms,
B is a radical of an aromatic amine, phenol, thiophenol, phenol ether, aromatic thioether, aromatic hydrocarbon, an aromatic heterocyclic compound, or an organic acid amide, which is free of diazonium groups.

9. A photosensitive composition as claimed in claim 1, which additionally contains a polyamide or a polyurethane in an amount of up to 40 percent by weight, based on the weight of the binder having carboxyl side groups.

10. A photosensitive recording material comprising a support and a photosensitive coating, wherein the photosensitive coating comprises a composition as claimed in claim 1.

11. A photosensitive composition as claimed in claim 1, wherein said binder is produced by the steps of:
mixing said anhydride with said polymer in the presence of a solvent to form a mixture;
heating said mixture to a reflux temperature;
reacting said mixture at said reflux temperature in the presence of a catalyst to form said reaction product; and
cooling said mixture and recovering said reaction product.

12. A photosensitive composition as claimed in claim 1, wherein said organic polycarboxylic acid is monomeric.

13. A photosensitive composition as claimed in claim 1, wherein said aqueous-alkaline developer is free of organic solvents.

14. A photosensitive composition as claimed in claim 1, wherein said diazonium salt polycondensation product is present in said composition in an amount of from about 5% to about 90% by weight, and said binder is present in an amount of from about 10% to about 95% by weight.

15. A photosensitive composition as claimed in claim 1, wherein said diazonium salt polycondensation product is present in said composition in an amount of from about 10% to about 70% by weight, and said binder is present in an amount of from about 30% to about 90% by weight.

16. A photosensitive composition as claimed in claim 1, wherein said binder is the reaction product of from about 0.5 to about 20 parts by weight anhydride and 100 parts by weight of said polymer.

17. A photosensitive composition as claimed in claim 1, wherein the acid number of the binder is from about 5 to about 80.

18. A photosensitive composition as claimed in claim 1, wherein the acid number of the binder is from about 10 to about 70.

* * * * *

UNITED STATES PATENT AND TRADEMARK OFFICE
CERTIFICATE OF CORRECTION

PATENT NO. : 4,631,245

DATED : Dec. 23, 1986

INVENTOR(S) : PAWLOWSKI

It is certified that error appears in the above-identified patent and that said Letters Patent is hereby corrected as shown below:

IN THE CLAIMS:

Claim 8, Column 19, line 9, kindly delete "P" and insert instead -- p --.

Claim 8, Column 19, line 14 to 15, kindly delete "-(CH$_2$-)$_q$-NR$^{11}$-," and insert instead -- -(CH$_2$)$_q$-NR$^{11}$-, --.

Claim 8, Column 19, line 15 to 16, kindly delete "-S-(CH$_2$-)$_r$-NR$^{11}$-," and insert instead -- -S-(CH$_2$)$_r$-NR$^{11}$-, --.

Claim 8, Column 19, line 16 to 17, kindly delete "-O-R$^1$-2-O-," and insert instead -- -O-R$^{12}$-O-, --.

Signed and Sealed this

Sixth Day of October, 1987

Attest:

DONALD J. QUIGG

Attesting Officer

Commissioner of Patents and Trademarks